(12) United States Patent
Sanford

(10) Patent No.: US 7,106,493 B2
(45) Date of Patent: Sep. 12, 2006

(54) MEMS-BASED VALVE DEVICE

(76) Inventor: James E. Sanford, 7051 S. Taylor Dr., Tempe, AZ (US) 85283

( * ) Notice: Subject to any disclaimer, the term of this patent is extended or adjusted under 35 U.S.C. 154(b) by 667 days.

(21) Appl. No.: 10/224,882

(22) Filed: Aug. 20, 2002

(65) Prior Publication Data

US 2003/0058515 A1 Mar. 27, 2003

Related U.S. Application Data

(60) Continuation-in-part of application No. 09/866,371, filed on May 25, 2001, now Pat. No. 6,436,610, which is a division of application No. 09/362,276, filed on Jul. 27, 1999, now Pat. No. 6,248,509.

(51) Int. Cl.
*G02B 26/08* (2006.01)

(52) U.S. Cl. ..................................... 359/298

(58) Field of Classification Search ................ 359/298, 359/230, 227, 223, 224, 290, 291; 430/313, 430/269, 396; 355/53, 71
See application file for complete search history.

(56) References Cited

U.S. PATENT DOCUMENTS

| | | | |
|---|---|---|---|
| 4,283,259 A | 8/1981 | Melcher et al. | |
| 4,598,197 A | 7/1986 | Morita et al. | |
| 5,062,689 A * | 11/1991 | Koehler | 359/230 |
| 5,109,149 A | 4/1992 | Leung | |
| 5,298,939 A | 3/1994 | Swanson et al. | |
| 5,451,489 A | 9/1995 | Leedy | |
| 5,459,098 A | 10/1995 | Maya | |
| 5,607,601 A | 3/1997 | Loper et al. | |
| 5,654,127 A | 8/1997 | Leedy | |
| 5,691,541 A | 11/1997 | Ceglio et al. | |
| 5,781,331 A | 7/1998 | Carr et al. | |
| 5,808,384 A | 9/1998 | Tabat et al. | |
| 5,835,195 A | 11/1998 | Gibson et al. | |
| 6,114,794 A | 9/2000 | Dhuler et al. | |
| 6,121,626 A | 9/2000 | Lin | |

OTHER PUBLICATIONS

Pain, Stephen W., "Magnificent MEMS," *Computer Shopper*, Jun. 1998, pp. 466-467, 472.
Löchel, B., et al., "Ultraviolet Depth Lithography and Galvanoforming for Micromachining," *Journal of the Electrochemical Society, Electrochemical Society*, Manchester, NH, U.S., vol. 143, No. 1, 1996, pp. 237-244.
Kawahito, Shoji, et al., "High-resolution micro-fluxgate sensing elements using closely coupled coil structures," *Sensors and Actuators A*, vol. 54, 1996, pp. 612-617.

* cited by examiner

*Primary Examiner*—Hung Xuan Dang
*Assistant Examiner*—Tuyen Tra
(74) *Attorney, Agent, or Firm*—Cahill, von Hellens & Glazer, P.L.C.

(57) ABSTRACT

A valve device formed of MEMS devices includes a generally-planar semiconductor substrate having one or more apertures to provide passages for fluids, gases, or light. Movable gate elements alternately cover or expose such apertures to either block or open such passages. Actuators in the form of miniature electromagnets repel or attract the gate elements to open or close the passages. The valve device may be used to control fluid delivery systems dispensing pressurized fluid, or in aspiration systems used to suction fluids. Alternatively, the gate elements may serve as light valves for selectively passing light from a light source through the substrate to a light-responsive surface.

4 Claims, 10 Drawing Sheets

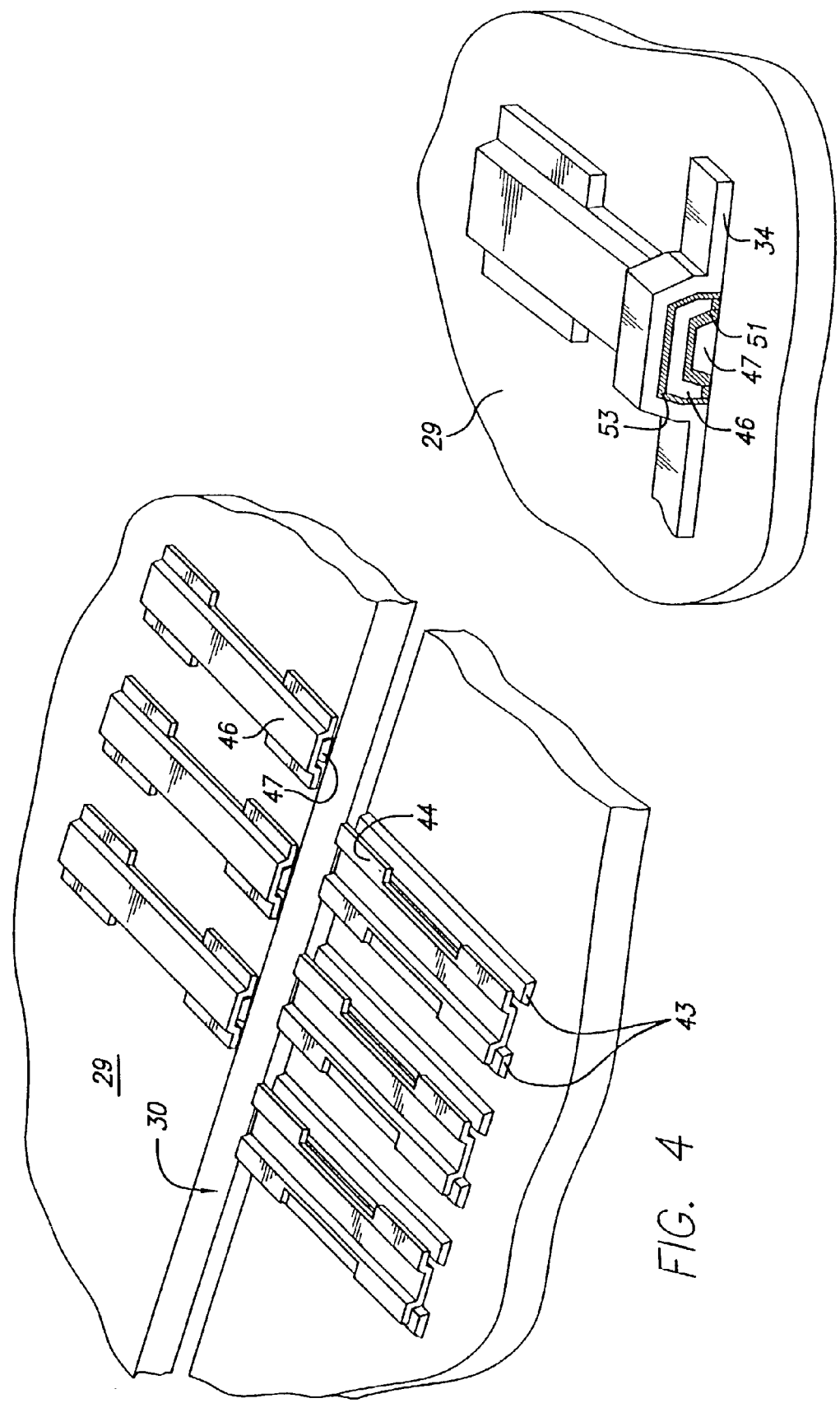

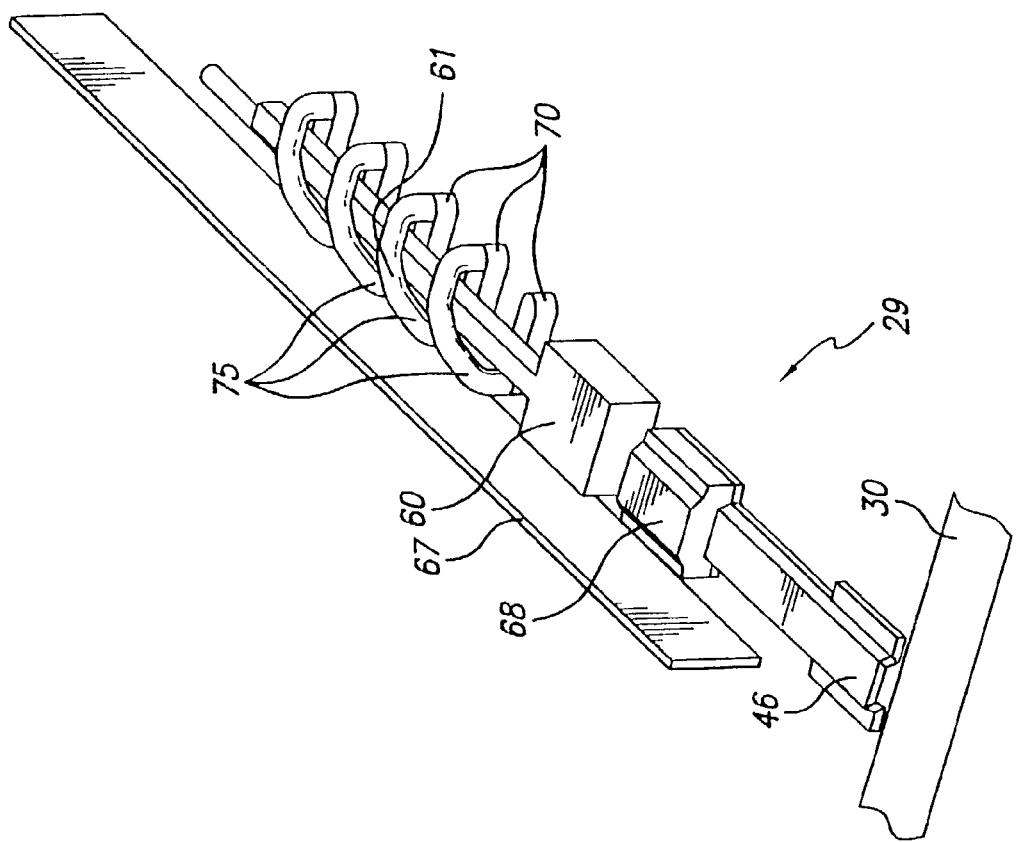
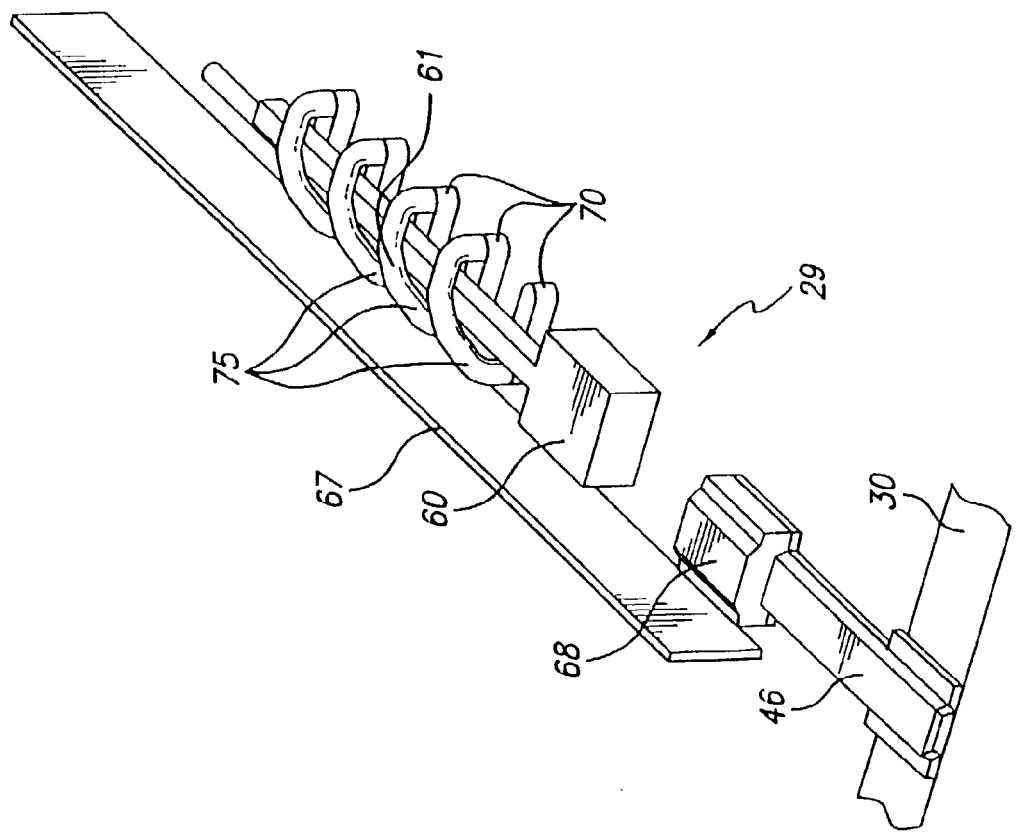

MEMS-BASED VALVE DEVICE

CROSS-REFERENCE TO RELATED APPLICATIONS

The present application is a continuation-in-part patent application of U.S. patent application Ser. No. 09/866,371, filed on May 25, 2001, to be issued as U.S. Pat. No. 6,436,610 on Aug. 20, 2002, which is, in turn, a divisional patent application based upon U.S. patent application Ser. No. 09/362,276, filed on Jul. 27, 1999, now issued U.S. Pat. No. 6,248,509.

BACKGROUND OF THE INVENTION

1. Field of the Invention

The present invention relates generally to light valves and fluid valves, and more particularly, to such valve devices using one or more micro electromechanical system ("MEMS") elements.

2. Description of the Relevant Art

In Applicant's parent application referenced above, Applicant discloses a MEMS maskless photoresist exposure system for selectively exposing a pattern of light to a photosensitive layer, such as a photoresist layer on a semiconductor wafer, without the use of a mask. The basic MEMS light shutter structure disclosed within Applicant's parent application has additional valve applications beyond exposing photosensitive layers to a predetermined pattern of light.

Fluid control valves have countless uses in controlling fluid delivery and fluid aspiration. Automotive fuel injectors are but one example of such fluid valves. Likewise, light valves which selectively pass or block a beam of light also find many applications. Indeed, a camera lens shutter, or other light shutter, may be regarded as such a light valve. There is often a need for a valve that can be opened and closed very quickly, and which can respond quickly to rapidly changing conditions. Valves typically require moving elements, and the movable elements often present inertial limitations that restrict the response time of such valves. In some instances, it is desirable to implement a valve function inside a rather small, confined space that is not large enough to contain a typical mechanical valve.

Accordingly, it is an object of the present invention to provide a valve device which can be used to selectively control the passage of fluid or light through such valve, and wherein the position of the valve can be rapidly adjusted to account for changed conditions.

Another object of the present invention is to provide such a valve that has very little inertial mass for allowing such valve to be opened or closed relatively quickly.

Still another object of the present invention is to provide a valve device that can be provided in a highly compact form for use within confined spaces.

A further object of the present invention is to provide such a valve device that can be controlled electronically, as by a microprocessor.

A yet further object of the present invention is to provide such a valve which itself can be formed easily and inexpensively using known photolithographic semiconductor processing techniques.

These and other objects of the present invention will become more apparent to those skilled in the art as the description of the present invention proceeds.

SUMMARY OF THE INVENTION

Briefly described, and in accordance with the preferred embodiment thereof, the present invention relates to a valve formed of MEMS devices for selectively opening or closing one or more passages to control the passage of gases, fluids, light, etc. The valve includes a generally-planar semiconductor substrate having at least a first aperture to provide a first passage, and optionally including a number of such apertures to provide a corresponding number of passages. A first gate element extends generally parallel to the plane of the semiconductor substrate, and is movably supported upon the semiconductor substrate. The first gate element is allowed to move between a first position that covers the first aperture to block the first passage, and a second position that exposes the first aperture to open the first passage. The valve device includes a first actuator secured to the semiconductor substrate, and cooperating with the first gate element, to selectively move the first gate element between its first and second positions. In the case where a number of passages are provided in the substrate, each passage has a gate element associated therewith, and each gate element has an actuator corresponding thereto. The gate elements can be actuated independently of each other, allowing some passages to be open while simultaneously closing the remainder of such passages.

As mentioned above, the substrate is formed of semiconductor material such as silicon, and the movable gate elements can also be formed from semiconductor material that had originally been deposited upon the substrate using known chemical vapor deposition techniques. Alternatively, the movable gate elements can be formed from a layer of metal that had originally been deposited upon the semiconductor substrate. In either case, the movable gate elements can be formed using conventional semiconductor wafer processing techniques. Preferably, the gate elements slide between their first and second positions in a linear motion, and one or more guides may be provided about each such gate element to help guide the gate elements between their first and second positions. Such guides can be disposed below and/or extend around each shutter element for guiding the movement thereof. The gate elements preferably incorporate a small permanent magnet. The corresponding actuators are actually small electromagnets in the form of a coiled electrical conductor for repelling or attracting the permanent magnets on the corresponding gate elements. The electrical coil extends along a longitudinal axis that is generally parallel to, and coaxial with, the axis of linear movement of the gate element. To prevent one such coil from influencing a neighboring coil, magnetic shielding is preferably interposed between adjacent actuators.

When used to control fluid delivery, the valve may be coupled to, or incorporated within, a source of pressurized fluid disposed on one side of the semiconductor substrate. The gate elements are selectively actuated to either permit pressurized fluid to pass through each passage (when the corresponding gate element is in its second position) or to block pressurized fluid from passing therethrough (when the corresponding gate element is in its second position), thereby controlling the flow of fluid through the substrate. It will be appreciated that all gate elements can be closed for noflow, all gate elements can be open for full-flow, or the number of gate elements that are open can be varied to adjust the flow between such extremes. If the fluid being delivered is engine fuel, then such a valve may serve as a fuel injector.

Similarly, if the source of pressurized fluid is replaced with a source of vacuum, the valve can be used in reverse to regulate the aspiration of fluid. For example, such a valve device could be used in endoscopic applications for aspirating fluids from the body.

Alternatively, the gate elements of the present valve may each serve as light valves for selectively passing light from a light source through the substrate. Where such valve device includes a light-responsive surface (i.e., a photosensitive film emulsion, charge-coupled device, etc.) positioned proximate to the substrate on the opposite side thereof as the source of light, then the valve may effectively serve as a camera shutter to help form an image of the object sourcing such light. In this event, the number of such passages that are opened effectively determines the aperture (or "f-stop"), and the time during which they are open effectively sets the shutter speed.

BRIEF DESCRIPTION OF THE DRAWINGS

FIG. 4 is a perspective view of a series of shutter elements positioned on both sides of a slit aperture formed in the substrate.

FIG. 5 is a perspective view of a shutter element and showing guides for guiding movement of the shutter element, as well as sacrificial layers used in manufacturing such shutter elements.

FIG. 6A is a perspective view of a shutter element being repelled by an associated electromagnet to cover a portion of the aperture.

FIG. 6B is a perspective view of the shutter element shown in FIG. 6A, but being attracted by its associated electromagnet to expose a portion of the aperture.

DETAILED DESCRIPTION OF THE PREFERRED EMBODIMENTS

Figure 1:
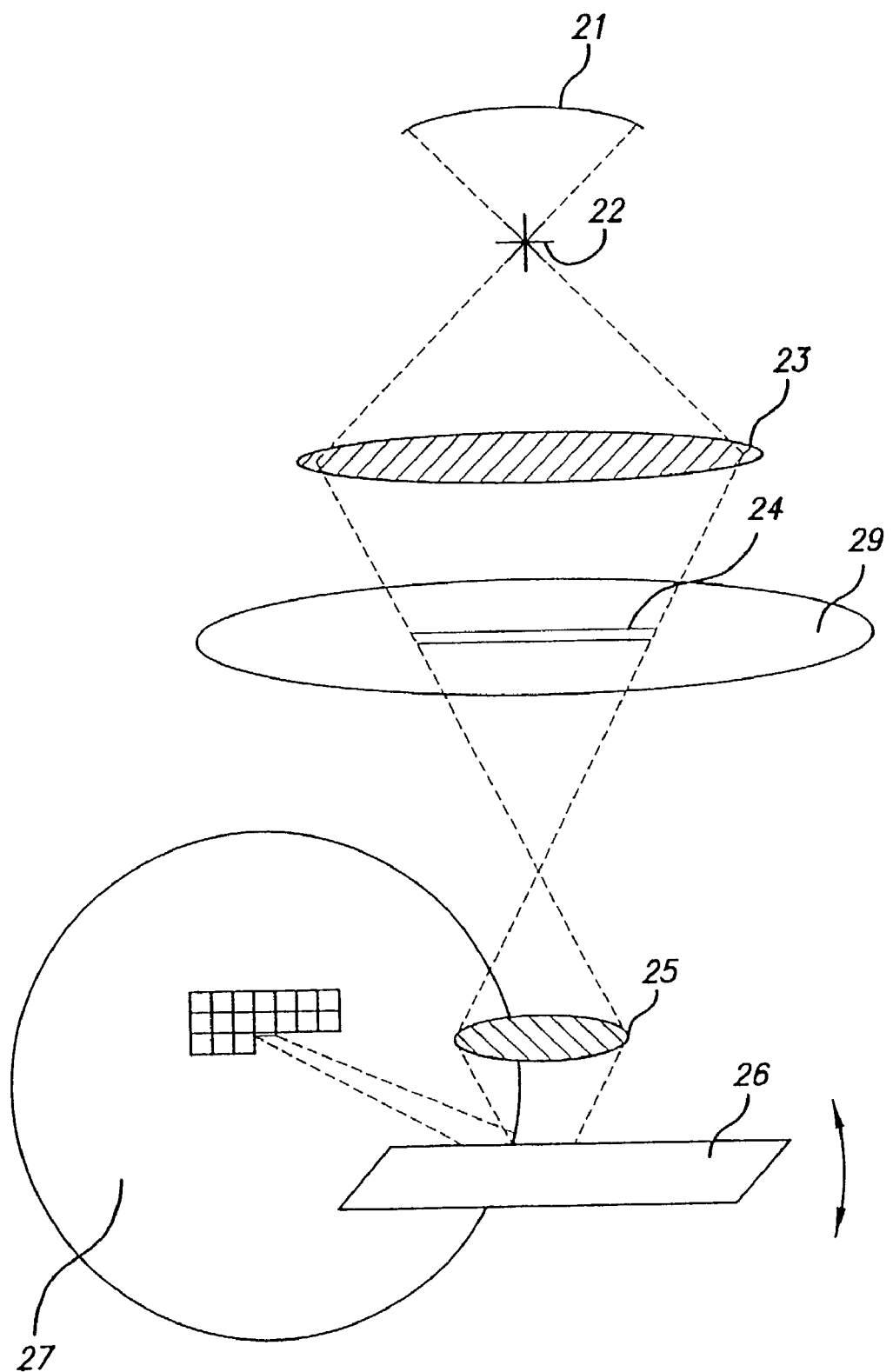
FIG. 1 is a schematic view of an optical projection system.

As indicated in FIG. 1, an optical projection system includes a mirror 21 and a light source 22. Light source 22 provides light of a desired wavelength suitable for exposing a photosensitive coating or other work surface of a work material. The light beam formed by light source 22 and mirror 21 is directed through a condenser lens 23 which focuses the light through a narrow slit aperture assembly 24 formed upon a substrate 29. In this sense, light source 22, mirror 21, and condenser 23 collectively form a source of a light beam that is directed toward slit aperture assembly 24. In a manner to be described in greater detail below, slit aperture assembly 24 has the ability to selectively block portions, or pixels, of the light beam transmitted by condenser lens 23. The patterned light beam passing through slit aperture assembly 24 is intercepted by a reduction lens 25 used to demagnify the projected image to a desired pixel size. A scanning mirror 26 then scans the projected image across a portion of a substrate 27 to be exposed, for example, a semiconductor wafer bearing a photoresist coating, or a photosensitive substrate. Substrate 27 thereby represents some form of work material that has a photosensitive work surface. Substrate 27 is supported by a precisely controlled indexed stage (not shown) which can be moved in incremental steps along an x-axis and y-axis to allow the desired portions of substrate 27 to be exposed by correspondingly patterned beams of light. The patterned light beam produced by slit aperture assembly 24 can be stepped across the photosensitive work surface of substrate 27, either by holding substrate 27 fixed while moving scanning mirror 26, by holding scanning mirror 26 fixed while moving the indexed stage that supports the work material, or by combined motion of both scanning mirror 26 and the indexed stage. In either of these cases, the relationship between the patterned light beam exiting the aperture assembly 24 and the work material support is adjusted in order to direct the patterned light beam at different portions of the photosensitive work surface of the work material.

Light source 22 may produce light of any desired wavelength ranging from visible light to wavelengths down to 5 nm, or soft X-rays. The lens system, including condenser lens 23 and demagnifying lens 25, must be adjusted to support the desired wavelength of light. Transmissive optics of current step-and-repeat optical projection systems can support wavelengths down to 193 nm. Future transmissive lens materials such as CaF are being developed for even shorter wavelengths. Reflective optics would need to be used for very short wavelengths such as extreme ultraviolet (EUV) wavelengths of 5 to 20 nm. As in prior art step-and-repeat optical projections systems, color filters (not shown) may be used to allow only desired wavelengths of light to pass through the optics.

Figure 2:
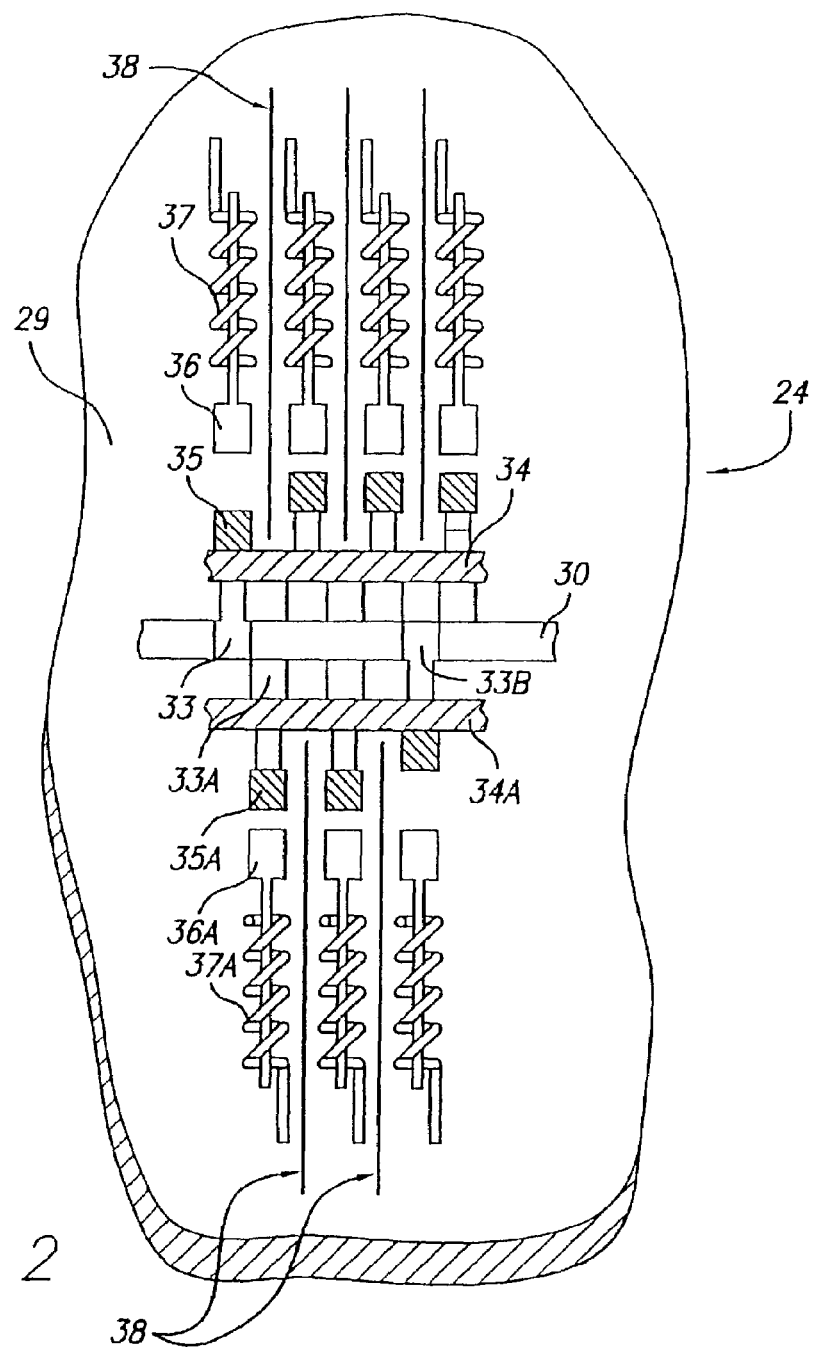
FIG. 2 is a top view of a slit aperture formed in a substrate, and including a series of sliding shutter elements used to selectively pattern the light beam passing through the slit aperture.

The preferred embodiment of slit aperture assembly 24 is shown in FIG. 2. Substrate 29 is preferably in the form of a generally planar semiconductor wafer made from silicon or a similar material. Substrate 29 has a long, narrow opening, or aperture 30, etched or otherwise formed through it. A series of micro electromechanical system, or MEMS, shutters, including those designated by reference numerals 33, 33A, and 33B, are placed alternately on either side of slit aperture 30, and are movably supported upon substrate 29 in such a way as to selectively block certain portions of aperture 30. Each of the shutters, including shutters 33, 33A, and 33B, extends generally parallel to the plane of substrate 29, and each is free to move back and forth, with a generally linear, sliding motion, between first and second end positions, to alternately cover or expose a selected portion of elongated aperture 30. For example, as shown in FIG. 2, shutter elements 33 and 33B are each extended to their first positions for covering a portion of elongated aperture 30 to preventing the passage of light therethrough, while shutter element 33A is retracted to its second position for exposing a portion of elongated aperture 30 for allowing the passage of light through such portion. In this manner, the series of shutter elements, including 33, 33A, and 33B, can be used to create a patterned light beam that exits through elongated aperture 30 of substrate 29.

Still referring to FIG. 2, the shutter elements disposed above aperture 30, including shutter element 33, are held to the surface of substrate 29 by a silicon bridge structure 34. Likewise, the shutter elements disposed below aperture 30, including shutter elements 33A and 33B, are held to the surface of substrate 29 by silicon bridge structure 34A. A magnetic material 35 with a permanent polarity (i.e., a permanent magnet) is deposited on one end of shutter element 33 and is influenced by an adjacent magnetic material 36 which extends within a small electrical coil structure 37. Magnetic material 36 and electrical coil 37 constitute an electromagnet for selectively repelling or attracting permanent magnet 35, and hence, shutter element 33. Similarly, magnetic material 35A with a permanent polarity is deposited on one end of shutter element 33A and is influenced by an adjacent magnetic material 36A which extends within electrical coil structure 37A.

The direction of the current running through electrical coil 37 determines the polarity of magnetic material 36, and therefore determines whether magnetic material 36 attracts or repels magnetic material 35. Conducting current through electrical coil 37 in a first direction causes the polarity of magnetic material 36 to be the same as that of magnetic material 35, thereby repelling magnetic material 35, and moving shutter element 33 to the position shown in FIG. 2 for blocking the related portion of aperture 30. In contrast, conducting current through electrical coil 37 in the opposite, second direction causes the polarity of magnetic material 36 to be the opposite to that of magnetic material 35, thereby attracting magnetic material 35, and moving shutter element 33 to its alternate position for exposing the related portion of aperture 30.

Similarly, the direction of the current running through electrical coil 37A determines the polarity of magnetic material 36A, and thereby determines whether magnetic material 36A attracts or repels magnetic material 35A. Conducting current through electrical coil 37A in the aforementioned second direction causes the polarity of magnetic material 36A to be the opposite that of magnetic material 35A, thereby attracting magnetic material 35A, and moving shutter element 33A to the position shown in FIG. 2 for exposing the related portion of aperture 30. In contrast, conducting current through electrical coil 37A in the aforementioned first direction causes the polarity of magnetic material 36A to be the same as that of magnetic material 35A, thereby repelling magnetic material 35A, and moving shutter element 33A to its alternate position for blocking the related portion of aperture 30.

Attraction of all shutter elements leaves aperture 30 completely open, allowing a continuous slit of light to be projected to the substrate to be exposed. Conversely, repulsion of all shutter elements causes aperture 30 to be completely blocked, allowing no light to pass. It will be appreciated that the electrical coils, including 37 and 37A, serve as actuators, each cooperating with a related one of the shutter elements for selectively moving its related shutter element between its first position and its second position. Magnetic shielding 38 should be used to isolate one coil structure 37 from the next, thereby preventing electromagnetic coupling between two adjacent coils.

The width of aperture 30 is generally equal to one pixel multiplied by the demagnification of the optics. If the optics demagnifies the image 10 times (i.e. 10×), and if the desired pixel size is 0.5 microns, then the width of aperture 30 would be 5.0 microns. The width of the slit forming aperture 30 is determined by the field size desired multiplied by the demagnification factor. The field size should be a multiple of the pixel size. If a field size of 1,000 microns is desired with a demagnification of 10×, then a 10,000 microns-wide slit aperture is required.

Figure 3A:
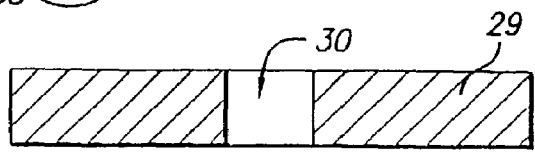
FIG. 3A is a cross-sectional drawing of an aperture formed in a semiconductor wafer.
Figure 3B:
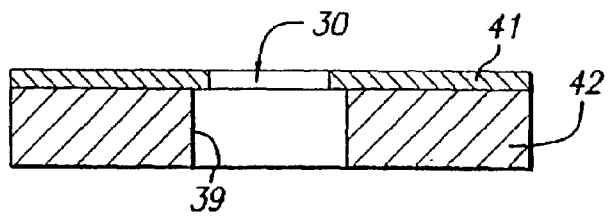
FIG. 3B is a cross-sectional drawing similar to that shown in FIG. 3A but wherein the dimensions of the aperture are determined by an additional layer of material disposed upon the, semiconductor wafer.

Referring to FIG. 3A, slit aperture 30 may be made by etching though substrate 29, which may again be formed from a simple silicon wafer. Alternatively, as shown in FIG. 3B, an additional layer 41, which is placed on top of silicon substrate 42, may be used to define the size of aperture 30, thereby allowing the aperture 39 etched within silicon substrate 42 to be somewhat oversized. The composition and thickness of this additional layer 41 may be chosen to allow approximately 10% transmission and a 180 degree phase change of the light. This will provide a phase shift effect as described by Watanabe. Therefore, the composition and thickness of layer 41 is necessarily dependent upon the wavelength of light used.

In order to ensure smooth linear motion of the shutter elements, aperture assembly 24 preferably includes a series of guides secured to substrate 29 for guiding the movement of the shutter elements. Referring to FIG. 4, shutter element 44 slides back and forth along a pair of guides 43 that extend below, and along opposite edges of, shutter 44, and which allow only back and forth movement of shutter 44. Guides 43 may be formed of silicon that is deposited upon substrate 29. Formation of shutter element 44 on top of guides 43 provides shutter 44 with a topography that enhances the strength of shutter 44.

Likewise, shutter 46 on the opposite side of elongated aperture 30 is formed upon a single, central underlying guide 47. Guide 47 again limits travel of shutter 46 to back and forth movement. Guide 47 can again be formed from silicon deposited upon substrate 29. It will be noted in FIG. 4 that shutter element 44 is generally V-shaped in cross-section, while shutter element 46 generally forms an inverted V-shape in cross-section. This allows shutters 44 and 46 to move into their extended (blocking) positions across aperture 30 without making contact with, or otherwise interfering with, the adjacent shutters coming from the opposite side of aperture 30. Shutter elements 44 and 46 must be sufficiently long to extend fully across aperture 30 in order to selectively block light from passing through their respective portions of aperture 30. Preferably, guides 43 and 46 are of approximately the same length as shutter elements 44 and 46, respectively.

Shutter elements 33, 33A, and 33B (see FIG. 2) and 44 and 46 (see FIG. 4) can be formed of semiconductor material, such as silicon that is deposited onto silicon substrate 29. More details regarding the process used to deposit and pattern such shutter elements are provided below. At this point in the description, it might be mentioned that such shutter elements can be formed from a layer of material, such as a deposited layer of silicon, that was initially secured to the underlying substrate, and which is subsequently patterned and etched to form such shutter elements. Other opaque materials such as tantalum or aluminum can be used to enhance the silicon shutters; alternatively, such metals can be used instead of silicon to form such shutter elements. Once again, such shutter elements can be formed from a layer of metal that was initially deposited upon the substrate, and which is subsequently patterned and etched to form the shutter elements.

The width of each shutter element is equal to the desired pixel size times the demagnification of the optics. In other words, referring to FIG. 1, if the length of the image projected onto substrate 27 by reduction lens 25 is, for example, one-tenth of the length of aperture assembly 24, then the width of each shutter element is ten times the desired pixel width of the demagnified beam that strikes substrate 27. The MEMS shutter elements may be made to essentially block the transmission of all light, or as described above, to allow approximately 10% transmission and a 180-degree phase change of the light for the described phase shift effect.

Referring now to FIG. 5, the shutter elements can be built up from substrate 29 using sacrificial oxide or nitride layers which are removed later in the manufacturing process to allow each shutter element to slide freely. First, the silicon guides 43, 47 are formed upon substrate 29, as by depositing or growing a layer of silicon upon substrate 29, and then patterning such layer to etch away all portions of such layer except those forming guides 43, 47. The upper surface of substrate 29 is then covered with a thin sacrificial layer of silicon nitride 51, which bridges over the patterned guides 43, 47, as shown in FIG. 5. Next, a second layer of silicon, designated in FIG. 5 by reference numeral 46, is deposited over the nitride layer 51 to ultimately form the silicon shutter elements. This second layer of silicon is then patterned and etched to form individual shutter elements, such as shutter element 46.

Still referring to FIG. 5, the substrate is then covered by a second thin sacrificial layer 53 of silicon nitride. A third layer of silicon is then deposited over second sacrificial nitride layer 53; this third layer of silicon is then patterned and etched to form the silicon retaining bridge 34 that extends above each of the shutters elements. Finally, the sacrificial silicon nitride layers 51 and 53 are selectively etched away to free shutter element 46 from substrate 29, guide 47 and bridge 34, thereby allowing free sliding movement of shutter 46 relative thereto.

As mentioned above, a magnetic material such as NiFe is deposited on top of one end of each shutter element with a permanent polarity in the same axis as the shutter movement, thus forming a permanent magnet on the end of the shutter element. Referring to FIGS. 6A & 6B, the polarity of the permanent magnet 68 is influenced by an adjacent non-movable magnet 60, which is surrounded by an electromagnetic coil 61 that extends along a longitudinal axis that is essentially collinear with non-movable magnet 60 and collinear with the sliding motion of shutter element 46. The coil configuration is such that as electrical current is moved through the coil in a first direction (see FIG. 6A), the non-movable magnet 68 is polarized to repel the adjacent shutter 46, thereby extending it over a portion of aperture 30, and therefore blocking the passage of light therethrough. When the current is reversed in coil 61 (see FIG. 6B), the polarity of non-movable magnet 60 reverses, attracting the shutter 46 and pulling it away from the aperture 30, thereby allowing the light to pass through the selected portion of aperture 30. Magnetic shielding 67, such as NiFe or other soft magnetic material, is interposed between adjacent coils to isolate each of the electrical coil assemblies so that the operation of one assembly does not interfere with the operation of the adjacent assemblies.

Figure 7:
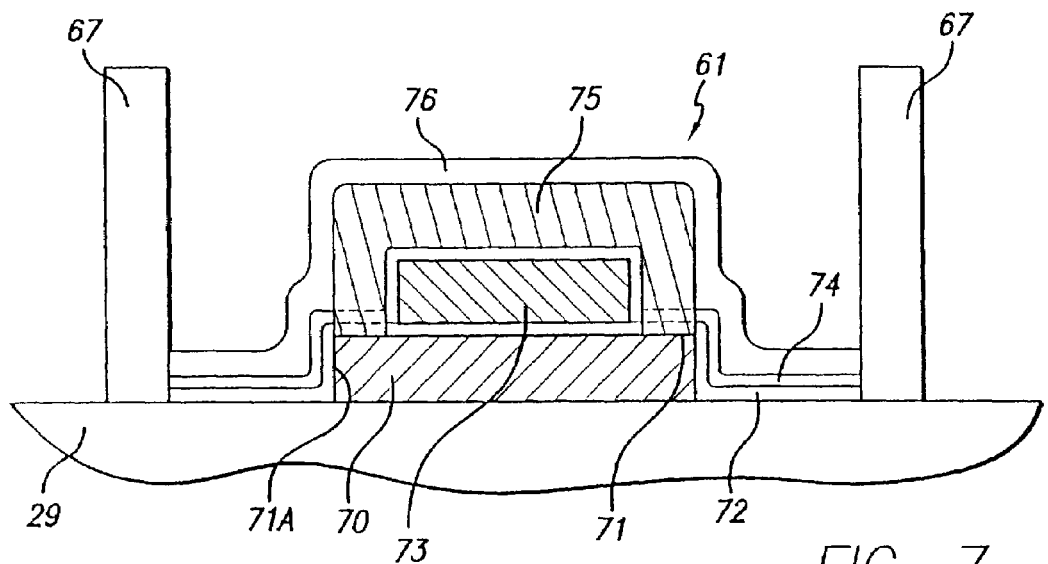
FIG. 7 is a cross-sectional drawing of an electrical coil assembly including stationary magnetic material disposed within such coil, insulating material, and magnetic shielding material separating adjacent electrical coils.

FIG. 7 illustrates the manner by which electrical coil 61 of FIGS. 6A/6B is produced. Initially, a first layer 70 of aluminum or other metal is deposited upon substrate 29; this first layer 70 of metal is then patterned and etched to form the lower rungs of electrical coil 61, as well as the lower rungs of the other electrical coils to be formed on substrate 29. As shown in FIGS. 6A/6B and FIG. 7, each of the lower rungs 70 of electrical coil 61 extend generally perpendicular to the longitudinal axis of electrical coil 61. In addition, each such lower rung has a first end 71 and an opposing second end 71A. After patterning the lower rungs 70, substrate 29 is then covered with an insulating material 72, such as silicon dioxide, which extends over substrate 29 and over the patterned lower rungs 70. Magnetic material 73 is then deposited above first insulative layer 72 and above, and perpendicular to lower rungs 70, along the longitudinal axis of electrical coil 61; this magnetic material may again consist of NiFe, extends and ultimately forms the non-movable magnet 60. Another encapsulating insulating layer of material 74 is deposited over substrate 29, covering first insulative layer 72 and magnetic material 73. Holes are then etched through the first insulative layer 72 and second insulative layer 74 above the first and second opposing ends 71 and 71A, respectively, of each lower rung to expose such ends. A further metal layer 75 is then deposited over substrate 29, covering second insulative layer 74, but extending within the aforementioned etched holes. This second metal layer 75 is then patterned to form the diagonal connecting arms 75 shown in FIGS. 6A/6B and FIG. 7, in order to connect the first end of one lower rung to the second end of the next succeeding lower rung, thereby forming electrical coil 61. Finally, a third insulative layer of material 76 is deposited over the substrate and entire coil assembly to insulate the diagonal connecting arms 75 of the electrical coils, such as coil 61.

As mentioned above, it is desirable to isolate adjacent electrical coils from each other by disposing magnetic shield material between such coils. As shown in FIG. 7, magnetic shielding material 67 is deposited along both sides of electrical coil 61, but spaced apart therefrom, to isolate each such electrical coil 61 from its adjacent neighboring coils.

Figure 8:
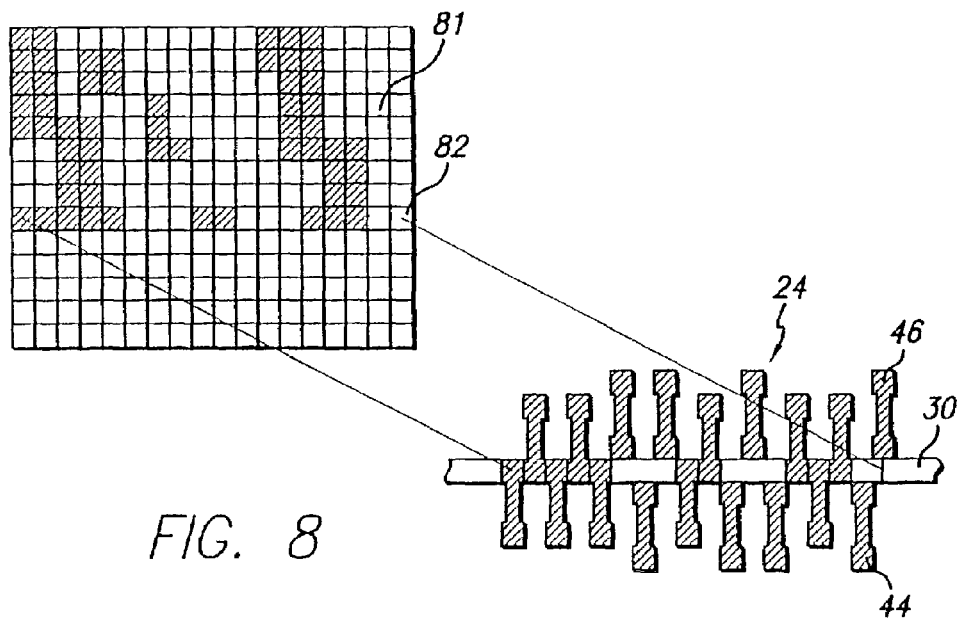
FIG. 8 is a top view of the photosensitive work surface to be exposed, broken into portions, and showing the configuration of shutter elements used to form the pattern to expose one of such portions.

Referring to FIGS. 1 and 8, the image resulting from the light passing through the slit aperture assembly 24 is projected to scanning mirror 26 which reflects the image to the substrate 27 to be exposed. As scanning mirror 26 is rotated, the shutter elements described above, including shutter elements 44 and 46, move in such a way over aperture 30 as to create the two dimensional image 81 shown in FIG. 8. Within FIG. 8, the image shown in the row designated 82 corresponds to the pattern of shutter elements covering or exposing aperture 30.

Figure 9A:
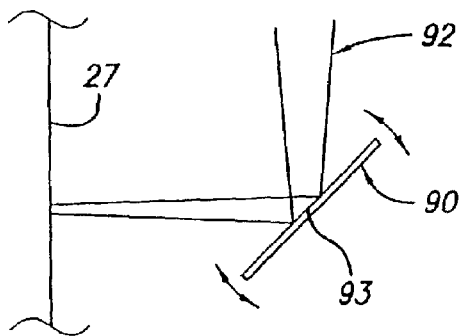
FIG. 9A is a schematic drawing showing the use of a planar scanning mirror for stepping the patterned light beam onto a corresponding portion of the photosensitive work surface to be exposed.
Figure 9B:
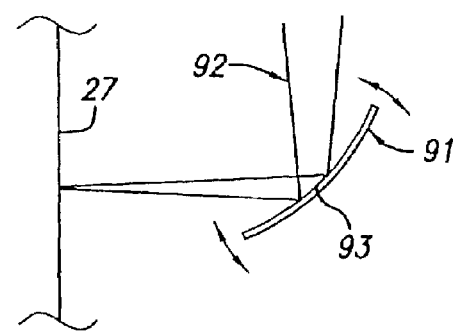
FIG. 9B is a schematic drawing similar to FIG. 9A but showing the use of a concave scanning mirror for stepping the patterned light beam onto a corresponding portion of the photosensitive work surface to be exposed.

Referring to FIG. 9A, flat scanning mirror 90 must rotate about the reflective plane 93 to limit scan distortions. On the other hand, the one-dimensional concave scanning mirror 91 shown in FIG. 9b offers several benefits over the flat scanning mirror 90 shown in FIG. 9A. First, by further focusing the incoming patterned beam of light 92 in one dimension, the intensity is increased allowing for higher doses of exposure and/or throughput. Second, because the projected image is less than one pixel wide, the shutter movement can be more precisely controlled reducing exposure gradients at the edge of features.

As mentioned above with respect to FIG. 1, an alternative to the use of a scanning mirror is to project the image directly to the substrate 27, and to move the stage which supports substrate 27 by incremental, indexed movements, to effectively scan the entire photosensitive surface of substrate 27 through the stationary image. Each time the substrate supporting stage is advanced, the shutter elements are moved to form a new patterned beam of light. The combination of stage indexing and shutter movements creates a two-dimensional image upon substrate 27, similar to that shown in FIG. 8. The precisely controlled substrate support stage must be synchronized with the shutter movement.

Several exposure techniques can be use to enhance the image quality. First, the scan rate can be adjusted to vary the exposure dose in a desired area on the substrate. Second, a retrace scan can be used to re-expose all or part of a given exposure. This will allow portions of a given pattern to be exposed at a different dose or doses than the bulk of the pattern. Third, optical proximity corrections can be used by simply correcting the pattern data file in a computer.

Figure 10:
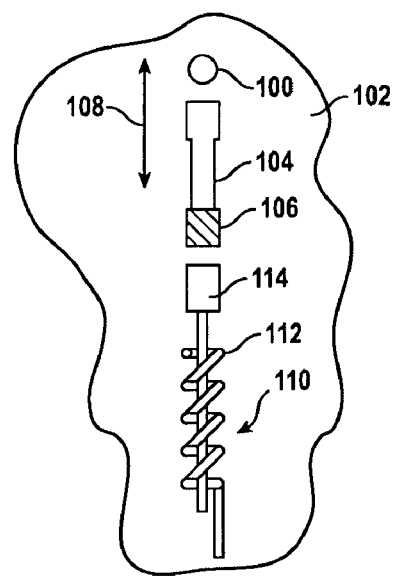
FIG. 10 illustrates a valve device incorporating the present invention and including a single aperture, a single gate element, and a single actuator for controlling the gate element.

Turning now to FIG. 10, a circular aperture 100 is formed in a substrate 102 for allowing either fluid, gas, or light to pass therethrough. While aperture 100 is illustrated as being circular, it could also be square or any other shape. A gate element 104, corresponding to shutter elements 33, 44 and 46 discussed above, including permanent magnet 106, is formed to slide linearly along the surface of substrate 102, as indicated by arrow 108. Gate element 104 is shown in a retracted position exposing aperture 100 for allowing the passage formed by aperture 100 to remain open. Actuator 110, including electrical coil 112 and magnetic material 114, is disposed adjacent gate element 104 for either attracting gate element 104 to the position shown, or repelling gate element 104 to cover over, and close off, aperture 100. Thus, FIG. 1 illustrates one basic valve device.

Figure 11:
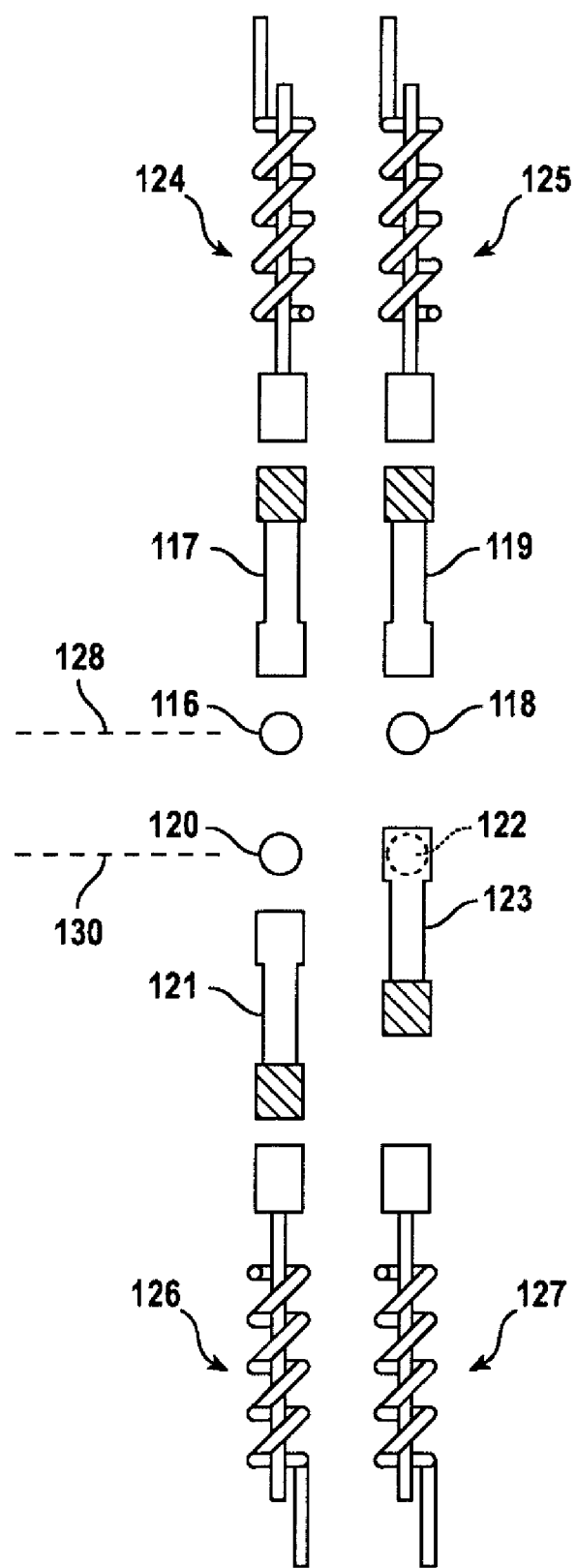
FIG. 11 illustrates a first embodiment of an array of such apertures, gate elements, and actuators.

As shown in FIG. 11, the basic valve device of FIG. 10 can be configured to form an array of controlled valve apertures, including apertures 116, 118, 120 and 122 (shown in dashed outline below gate element 123). Each such aperture includes an associated gate element 117, 119, 121, and 123, respectively. Likewise, each gate element is paired with an associated actuator 124, 125, 126, and 127. As indicated by dashed lines 128 and 130, this array can be extended to provide as many apertures as are needed.

Figure 12:
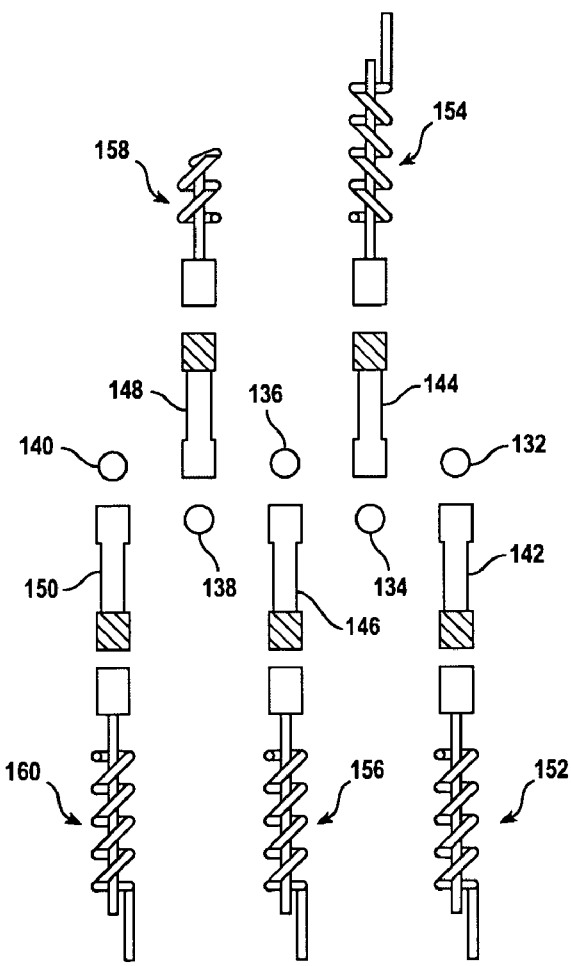
FIG. 12 illustrates a second embodiment of an array of such apertures, gate elements, and actuators.

FIG. 12 illustrates an alternate array configuration including apertures 132–140 that are selectively exposed by gate elements 142–150 under the control of actuators 152–160, respectively. Once again, this array can be extended to the right and/or to the left to provide any desired number of apertures.

Figure 13:
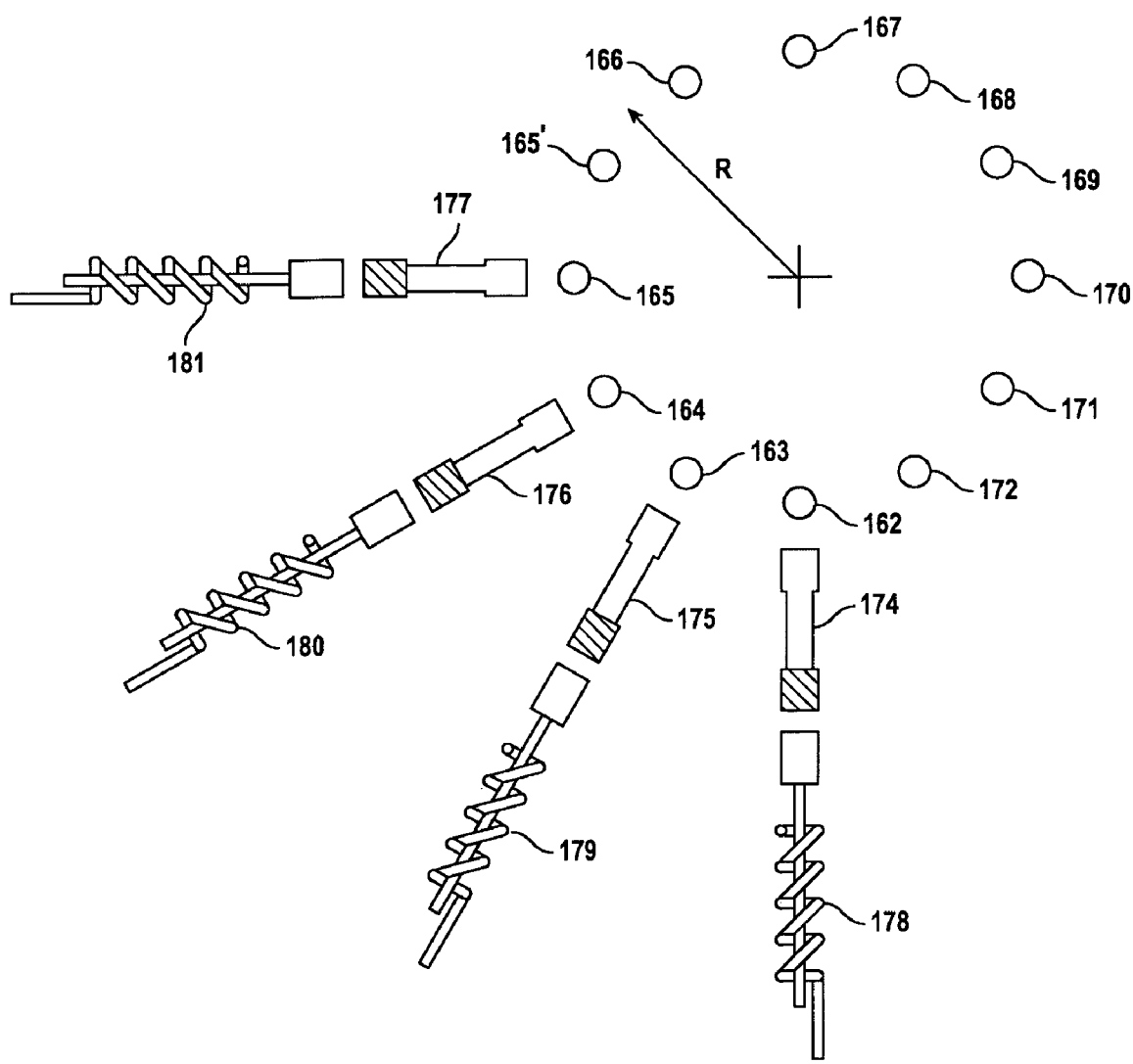
FIG. 13 illustrates a circular arrangement of such apertures, gate elements, and actuators.

FIG. 13 illustrates yet another embodiment of the valve device wherein the apertures are configured in a circular array, including apertures 162–172 each spaced from the center of the circular pattern by radius R. Each aperture has associated therewith a gate element and related actuator, such as gate elements 174–177, and actuators 178–181.

Figure 14:
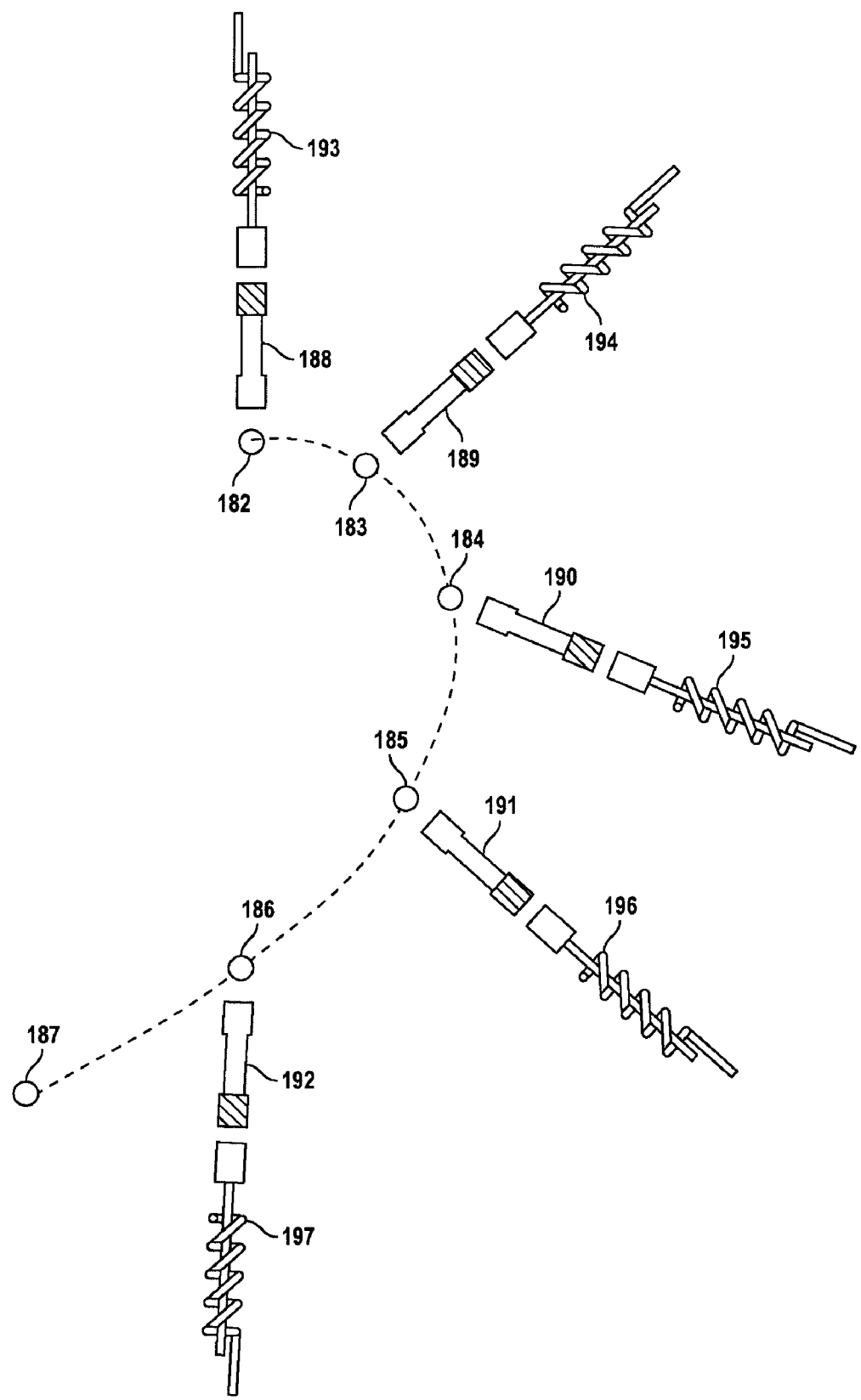
FIG. 14 illustrates an outwardly spiraling arrangement of such apertures, gate elements, and actuators.
Figure 15:
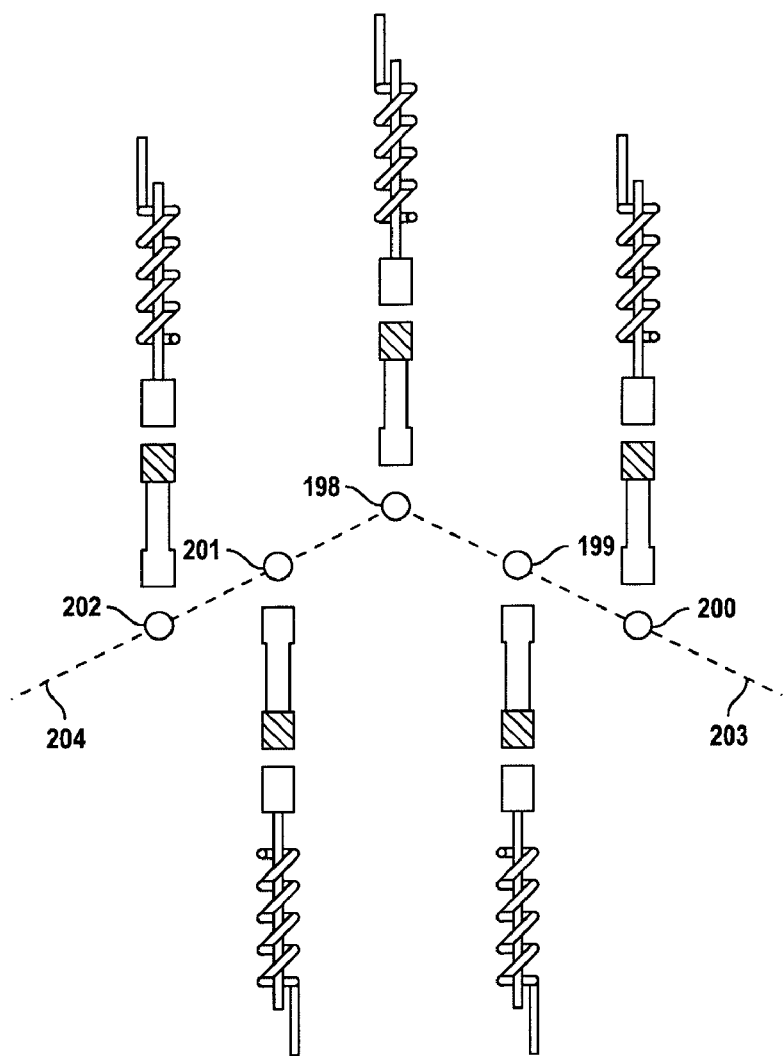
FIG. 15 illustrates a triangular array of such apertures, gate elements, and actuators.

FIG. 14 illustrates yet another configuration of the valve device wherein apertures 182–187 are arranged in a spiral pattern that spirals outwardly from the center. Again, each aperture is associated with a gate element (188–192) and an actuator (193–197). FIG. 15 shows still another configuration wherein apertures 198–202 are configured in a triangular pattern which, as indicated by dashed lines 203 and 204, can be extended to any desired size.

For applications in harsh, high-pressure environments, such as fuel injection systems, the silicon substrate is relatively strong and inert. The gate element may be formed from a deposited layer of titanium for added durability. Those skilled in the art will appreciate that the gate element need not seal its aperture in an air-tight fashion, as merely covering such aperture greatly restricts the flow through the passage formed by such aperture. While the gate elements may be exposed to relatively high pressure fluids, such gate elements are very small, and accordingly, such pressures are applied over a very small surface area.

As indicated above, the actuators can be independently controlled whereby all gate elements can be opened, all gate elements can be closed, or a variable number of such gate elements can be opened. In this way, flow rates through the system of apertures can be varied continuously over a wide range. Moreover, because the gate elements can be moved relatively quickly, such flow rates can be changed very quickly, as might be required in high speed engines using fuel injection.

Figure 16:
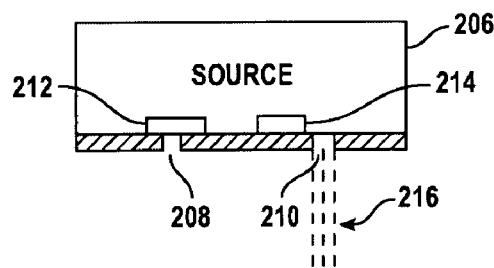
FIG. 16 illustrates the use of the valve device in a fluid delivery system.

FIG. 16 is a simple illustration of such a valve device being used in conjunction with a source of pressurized fluid 206. The valve device substrate includes two apertures in this simple illustration, designated 208 and 210. Aperture 208 is closed by gate element 212, while aperture 210 is opened because gate element 214 is retracted. Accordingly, pressurized fluid, indicated by dashed lines 216, is released from the passage formed by aperture 210. Such flow rate would be approximately doubled if gate element 212 were retracted.

Figure 17:
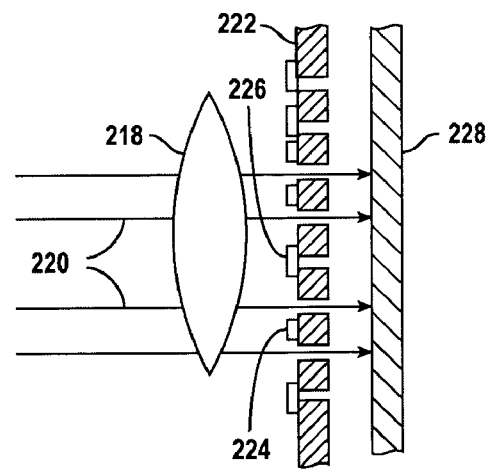
FIG. 17 illustrates the use of the valve device to form the shutter of a camera.

FIG. 17 is a simple illustration of an application of such a valve device to form a shutter in a photographic imaging device, such as a camera. Lens 218 directs light rays 220 toward substrate 222. Some passages within substrate 222 are opened while others are closed by gate elements such as those designated 224 and 226. Light passing through the opened passages strikes light-responsive surface 228, which might be an emulsion-type film, or perhaps a charge-coupled device responsive to light. By controlling the number of passages that are opened, the substrate acts like an aperture to control the amount of light hitting surface 228 at any particular moment. Moreover, by controlling how long such passages remain open, substrate 222 also acts like a camera shutter. Because MEMS devices can be moved very quickly, very short shutter speeds can be achieved to "stop" high-speed motion.

The gate elements and related electromagnet actuators are relatively small, and the valve structure can therefore be reduced to a very dense structure for fitting within close quarters. Appropriate wiring (not shown) leading from the valve device may be coupled to a microcontroller located outside the valve in order to control the function of the valve. In addition, all movement is positively induced by magnetic forces, and no spring mechanisms or other attached devices are required to return the shutter elements to their initial position.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

I claim:

1. A valve for selectively opening or closing a passage comprising in combination:
   a. a semiconductor substrate having at least a first aperture formed therein to provide a first passage, said semiconductor substrate generally lying in a plane;
   b. a first gate element movably supported upon said semiconductor substrate, said first gate element having a first position covering said first aperture to block said first passage, and said first gate element having a second position exposing said first aperture to open said first passage, said first gate element extending generally parallel to the plane of said semiconductor substrate, and wherein said first gate element incorporates a small permanent magnet; and
   c. a first actuator secured to said semiconductor substrate and cooperating with said first gate element for selectively moving said first gate element between its first position and its second position, and wherein said first actuator includes an electromagnet for repelling or attracting said first gate element.

2. A valve for selectively opening or closing a passage comprising in combination:
   a. a semiconductor substrate having at least a first aperture formed therein to provide a first passage, said semiconductor substrate generally lying in a plane;
   b. a first gate element movably supported upon said semiconductor substrate, said first gate element having a first position covering said first aperture to block said first passage, and said first gate element having a second position exposing said first aperture to open said first passage, said first gate element extending generally parallel to the plane of said semiconductor substrate;
   c. a first actuator secured to said semiconductor substrate and cooperating with said first gate element for selectively moving said first gate element between its first position and its second position; and
   d. a source of pressurized fluid communicating with said semiconductor substrate, said first gate element selectively permitting pressurized fluid to pass through said first passage when said first gate element is in its second position.

3. The valve device recited by claim 2 wherein said source of pressurized fluid is engine fuel.

4. A valve for selectively opening or closing a passage comprising in combination:
   a. a semiconductor substrate having at least a first aperture formed therein to provide a first passage, said semiconductor substrate generally lying in a plane;
   b. a first gate element movably supported upon said semiconductor substrate, said first gate element having a first position covering said first aperture to block said first passage, and said first gate element having a second position exposing said first aperture to open said first passage, said first gate element extending generally parallel to the plane of said semiconductor substrate;
   c. a first actuator secured to said semiconductor substrate and cooperating with said first gate element for selectively moving said first gate element between its first position and its second position; and
   d. a source of vacuum communicating with said semiconductor substrate, said first gate element selectively permitting the vacuum to aspirate fluid through said first passage when said first gate element is in its second position.

* * * * *